United States Patent
Lee

(10) Patent No.: US 9,461,162 B2
(45) Date of Patent: Oct. 4, 2016

(54) SEMICONDUCTOR INTEGRATED CIRCUIT DEVICE HAVING REDUCED UNIT CELL AREA

(71) Applicant: SK hynix Inc., Icheon-si, Gyeonggi-do (KR)

(72) Inventor: Myoung Jin Lee, Icheon-si (KR)

(73) Assignee: SK HYNIX INC., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/165,169

(22) Filed: Jan. 27, 2014

(65) Prior Publication Data

US 2014/0138768 A1 May 22, 2014

Related U.S. Application Data

(62) Division of application No. 13/087,767, filed on Apr. 15, 2011, now abandoned.

(30) Foreign Application Priority Data

Apr. 16, 2010 (KR) .................. 10-2010-0035279
Apr. 14, 2011 (KR) .................. 10-2011-0034636

(51) Int. Cl.
*H01L 27/108* (2006.01)
*H01L 29/76* (2006.01)
*H01L 29/78* (2006.01)

(52) U.S. Cl.
CPC .......... *H01L 29/78* (2013.01); *H01L 27/10814* (2013.01); *H01L 27/10823* (2013.01); *H01L 27/10852* (2013.01); *H01L 27/10876* (2013.01)

(58) Field of Classification Search
CPC .............. H01L 27/10876; H01L 27/10885; H01L 27/10891; H01L 27/10814; H01L 27/10864; H01L 29/66666; H01L 29/7827; H01L 27/10882; H01L 27/10841; H01L 27/10888; H01L 27/108; H01L 27/10852; H01L 27/2454; H01L 29/4236; H01L 29/78642; H01L 27/0688; H01L 27/10805; H01L 27/10808; H01L 29/7926; H01L 29/7889
USPC ....... 257/296, 302, 330, 329, 306, 303, 328, 257/304, 311, 312, 334, E29.262, E27.084; 365/63, 51, 72
See application file for complete search history.

(56) References Cited

U.S. PATENT DOCUMENTS 6,867,994 B2 * 3/2005 Tsukikawa ................. 365/72
7,335,936 B2 * 2/2008 Sommer et al. ............ 257/301
(Continued)

FOREIGN PATENT DOCUMENTS

JP 2009272545 A 11/2009
KR 1020040053753 A 6/2004
(Continued)

*Primary Examiner* — Shouxiang Hu
(74) *Attorney, Agent, or Firm* — William Park & Associates Ltd.

(57) ABSTRACT

A semiconductor integrated circuit device includes a semiconductor substrate; a plurality of word lines extending parallel to one another on the semiconductor substrate; a plurality of bit lines extending parallel to one another on the semiconductor substrate and arranged to intersect the word lines, thereby delimiting a plurality of crossing regions and a plurality of unit memory cells; a plurality of gate electrodes formed to control respective pairs of unit memory cells adjacent to each other with the word lines interposed therebetween and to contact corresponding word lines on one sides of the crossing regions; storage node contacts respectively formed in spaces of the unit memory cells; and a plurality of bit line contacts formed to contact the respective bit lines on one sides of the crossing regions.

4 Claims, 12 Drawing Sheets

(56) References Cited

U.S. PATENT DOCUMENTS

| | | | |
|---|---|---|---|
| 7,615,817 B2 * | 11/2009 | Moon et al. | 257/302 |
| 8,508,047 B2 * | 8/2013 | Brennan | 257/758 |
| 2010/0237407 A1 * | 9/2010 | Nojima | 257/329 |
| 2011/0220977 A1 * | 9/2011 | Yoon et al. | 257/296 |

FOREIGN PATENT DOCUMENTS

| | | |
|---|---|---|
| KR | 1020060074231 A | 7/2006 |
| KR | 1020100005986 A | 1/2010 |

\* cited by examiner

SEMICONDUCTOR INTEGRATED CIRCUIT DEVICE HAVING REDUCED UNIT CELL AREA

CROSS-REFERENCES TO RELATED APPLICATION

This application is a divisional application of U.S. patent application Ser. No. 13/087,767, filed on Apr. 15, 2011, published as U.S. 2011/0254085 on Oct. 20, 2011, which is incorporated herein by reference in its entirety.

BACKGROUND

1. Technical Field

The present invention relates to a semiconductor integrated circuit device and a method for manufacturing the same, and more particularly, to a semiconductor integrated circuit device which has a reduced unit cell area and a method for manufacturing the same.

2. Related Art

As integration of semiconductor integrated circuit devices increase, an area occupied by unit memory cell decreases. In correspondence to the decrease in the area of the memory cell, various optimization attempts have been made, such as forming connection members for connecting a switching element, a bit line, a word line and a capacitor in a buried type.

One suggestion has been a vertical channel semiconductor device in which a source and a drain of a MOS transistor used as a switching element are vertically arranged with a vertical channel.

The vertical channel MOS transistor by includes a pillar which is vertical with respect to a semiconductor substrate, a gate electrode which is formed around the pillar, and a source and a drain which are formed on upper and lower ends of the gate electrode.

Such a vertical channel MOS transistor has an advantage that the area of the vertical channel MOS transistor does not increase even when a channel length is increased. The vertical channel MOS transistor may also make use of a buried bit line.

However, since the pillar of the vertical channel MOS transistor should be formed as described above and the gate electrode should be formed to surround the outer circumference of the pillar, manufacturing processes are substantially complicated. For example, in order to form the gate electrode using the pillar, a complicated etching process is needed, and it is difficult to secure the characteristics of a transistor due to the complicated process.

Moreover, because of the small margin of a process of burying a metal bit line in a predefined space of the semiconductor substrate, contact property with the drain formed on the pillar may become poor.

Therefore, a memory cell structure capable of securing device characteristics while not increasing the area occupied by one unit cell is demanded.

SUMMARY

A semiconductor integrated circuit device which can secure device performance without increasing the area of a unit cell and a method for manufacturing the same are described herein.

In one embodiment of the present invention, a semiconductor integrated circuit device includes: a semiconductor substrate; a plurality of word lines extending parallel to one another on the semiconductor substrate; a plurality of bit lines extending parallel to one another on the semiconductor substrate and arranged to intersect the word lines, thereby delimiting a plurality of crossing regions where the word lines intersect the bit lines and a plurality of unit memory cells; a plurality of gate electrodes formed to control respective pairs of unit memory cells adjacent to each other with the word lines interposed therebetween and to contact corresponding word lines on one sides of the crossing regions; storage node contacts respectively formed in spaces of the unit memory cells; and a plurality of bit line contacts formed to contact the respective bit lines on one sides of the crossing regions. The gate electrodes of the unit memory cells adjacent to each other with the word lines interposed therebetween, are structured in such a way as to share the corresponding word lines, and the bit line contacts of the unit memory cells adjacent to each other with the bit lines interposed therebetween, contact one another in such a way as to share corresponding bit lines. Any one gate electrode positioned on an even word line among the word lines is arranged between a pair of gate electrodes positioned on adjoining odd word lines, and any one bit line contact positioned on an even bit line among the bit lines is arranged between a pair of bit line contacts positioned on adjoining odd bit lines.

In another embodiment of the present invention, a semiconductor integrated circuit device includes: a plurality of word lines and a plurality of bit lines which intersect each other; and a plurality of memory cells connected with the word lines and the bit lines, the memory cells comprising gate electrodes positioned on the word lines on one sides of crossing regions where the word lines intersect the bit lines; bit line contacts positioned on the bit lines on one sides of the crossing regions; and storage node contacts formed in spaces which are surrounded by the word lines and the bit lines.

In another embodiment of the present invention, a semiconductor integrated circuit device includes: a semiconductor substrate; an isolation layer formed in the semiconductor substrate to delimit active regions; a plurality of word lines buried in the semiconductor substrate and extending parallel to one another with a predetermined spacing; a plurality of bit lines extending parallel to one another on the semiconductor substrate and arranged to intersect the word lines, thereby delimiting a plurality of crossing regions and a plurality of unit memory cells; a plurality of storage node contacts respectively formed in the active regions of spaces of the unit memory cells; and a plurality of bit line contacts formed at bit line forming positions which correspond to one sides of the crossing regions. The unit memory cells adjacent to each other with the word lines interposed therebetween, are structured in such a way as to share the corresponding word lines, and bit line contacts of the unit memory cells adjacent to each other with the bit lines interposed therebetween, contact one another in such a way as to share corresponding bit lines. Any one gate electrode positioned on an even word line among the word lines is arranged between a pair of gate electrodes positioned on adjoining odd word lines, and any one bit line contact positioned on an even bit line among the bit lines is arranged between a pair of bit line contacts positioned on adjoining odd bit lines.

In another embodiment of the present invention, a method for manufacturing a semiconductor integrated circuit device includes the steps of: forming drain regions in predetermined portions of a semiconductor substrate; forming first bit line contacts in the semiconductor substrate in such a way as to contact the drain regions; forming word lines in preselected portions of the semiconductor substrate; forming source regions by implanting impurities into portions of the semiconductor substrate which correspond to both sides of the word lines and both sides of the first bit line contacts; forming selectively second bit line contacts on the first bit line contacts; forming bit lines over the second bit line contacts in a direction crossing with the word lines; and forming storage node contacts over the source regions.

The step of forming the word lines includes the steps of: defining trenches in the preselected portions of the semiconductor substrate; forming a gate dielectric layer on inner walls of the trenches; and filling a conductive substance in the trenches.

In another embodiment of the present invention, a semiconductor integrated circuit device includes: first to third word lines extending along a first direction; first to third bit lines extending along a second direction crossing the first direction; a first memory cell formed in a space which is surrounded by the first word line, the second word line, the first bit line and the second bit line; a second memory cell formed in a space which is surrounded by the first word line, the second word line, the second bit line and the third bit line; and a third memory cell formed in a space which is surrounded by the second word line, the third word line, the first bit line and the second bit line, wherein the first memory cell and the third memory cell share the second word line, and wherein the first memory cell and the second memory cell share the second bit line.

The first to third word lines are formed in such a way as to be buried into a semiconductor substrate.

BRIEF DESCRIPTION OF THE DRAWINGS

Features, aspects, and embodiments are described in conjunction with the attached drawings, in which.

DETAILED DESCRIPTION

Hereinafter, a semiconductor integrated circuit device and a method for manufacturing the same according to the present invention will be described below with reference to the accompanying drawings through exemplary embodiments. It may be noted that the various embodiments described are for illustrative purposes and do not limit the invention to any way.

Figure 1:
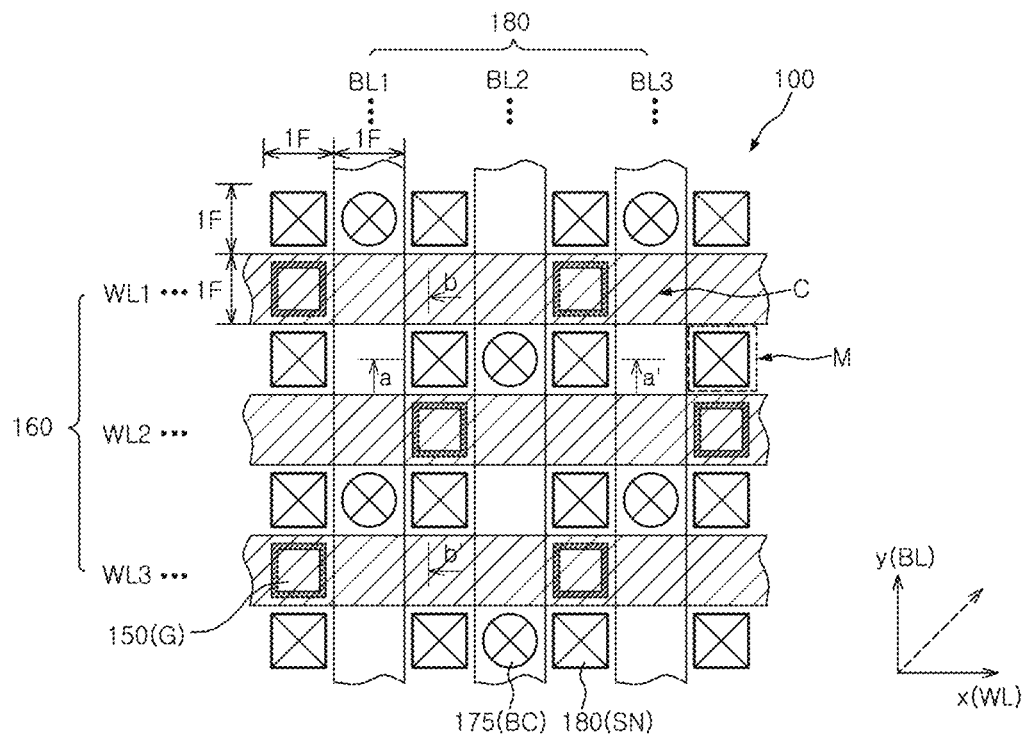
FIG. 1 is a plan view illustrating a semiconductor integrated circuit device in accordance with an embodiment of the present invention.
Figure 2:
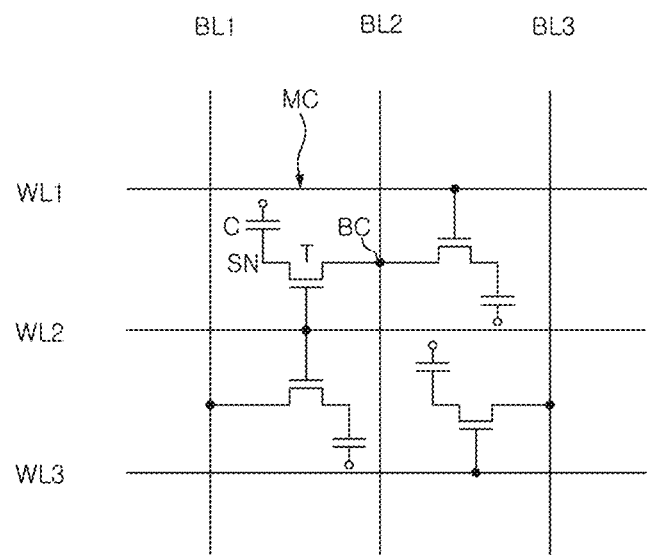
FIG. 2 is a schematic circuit diagram of the semiconductor integrated circuit device according to the embodiment of the present invention.

FIG. 1 is a plan view illustrating a semiconductor integrated circuit device in accordance with an embodiment of the present invention, and FIG. 2 is a schematic circuit diagram of the semiconductor integrated circuit device according to the embodiment of the present invention.

Referring to FIGS. 1 and 2, a semiconductor integrated circuit device 100 may include word lines WL1, WL2 and WL3: 160, bit lines BL1, BL2 and BL3: 180, switching transistors T, bit line contacts 175(BC), and storage nodes 190(SN). The bit line contacts 175(BC) may be called bit line contact pads and the storage nodes 190(SN) may be called storage node contact pads.

In the present embodiment, for the sake of convenience in explanation, a cell array of three word lines and three bit lines will be described as an example.

The plurality of word lines WL1, WL2 and WL3 is shown as extending along the x direction of the drawing with a predetermined spacing on a semiconductor substrate 10. These word lines WL1, WL2 and WL3 are arranged with substantially the same line width and spacing. The line width and spacing may define a minimum feature size F for manufacturing a semiconductor device. The word lines WL1, WL2 and WL3 are electrically connected with gate electrodes 150(G) which constitute the switching transistors T.

The plurality of bit lines BL1, BL2 and BL3 is also shown as extending with a predetermined spacing on the semiconductor substrate 10 in such a way as to intersect the word lines WL1, WL2 and WL3. Accordingly, a cell array may be divided into matrix spaces M which are surrounded by the plurality of word lines WL1, WL2 and WL3 and the plurality of bit lines BL1, BL2 and BL3, and crossing regions C of the plurality of word lines WL1, WL2 and WL3 and the plurality of bit lines BL1, BL2 and BL3. The matrix spaces M may be explained as unit memory cell regions MC. The line width and spacing of the bit lines BL1, BL2 and BL3 may also define a minimum feature size F for manufacturing a semiconductor device. Due to this fact, each of the matrix spaces M has an area of $1F^2$.

The switching transistors T may comprise the gate electrodes 150(G) which are connected with the word lines WL1, WL2 and WL3, source regions (not shown) which are formed in a semiconductor substrate (not shown) corresponding to the memory cell regions MC on both sides of the gate electrodes 150(G), and drain regions (not shown) which correspond to the semiconductor substrate under the bit lines BL1, BL2 and BL3.

The bit line contacts 175(BC) may be formed to contact predetermined portions of the bit lines BL excluding the crossing regions C.

The storage nodes 190(SN) may be formed in the respective matrix spaces M. The storage nodes 190(SN) are nodes which connect the bottom electrodes of capacitors with the source regions. In order to secure large capacity, a number of the storage node 190(SN) may be formed in a limited area.

As shown in FIG. 2, the semiconductor integrated circuit device 100 according to the present embodiment may be designed in such a manner that memory cells MC and other adjacent memory cells MC share the word lines WL1, WL2 and WL3 and the bit lines BL1, BL2 and BL3.

The gate electrodes 150(G) and the bit line contacts 175(BC) may be arranged according to following explanation.

First, the gate electrodes 150(G) may be positioned on the word lines WL1, WL2 and WL3 excluding the crossing regions C. The gate electrodes 150(G) may be formed commonly with respect to the unit memory cells which face each other with the word lines WL1, WL2 and WL3 interposed therebetween. The gate electrodes 150(G) serve as common gate electrodes of the unit memory cells MC which face each other with the word lines WL1, WL2 and WL3 contacting the gate electrodes 150(G) interposed therebetween.

Figure 3:
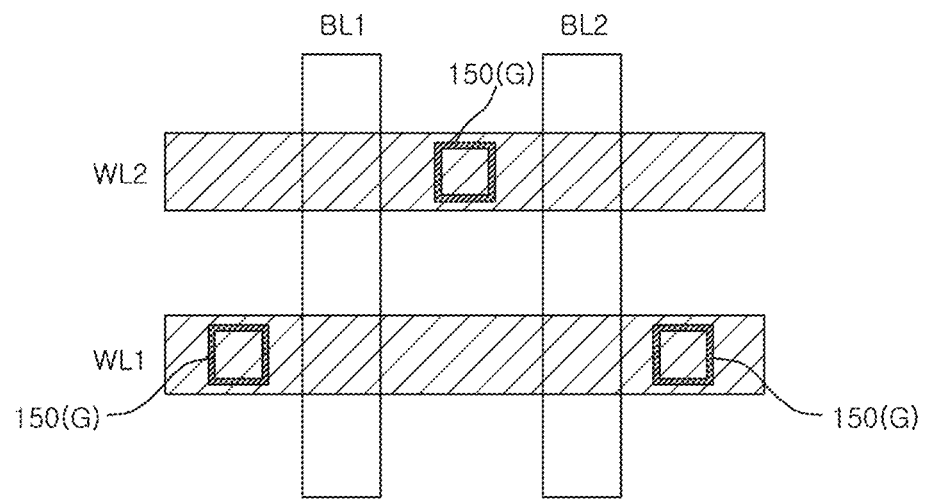
FIG. 3 is a schematic plan view of the semiconductor integrated circuit device illustrating the layout of gate electrodes according to the embodiment of the present invention.

In other words, as can be seen from FIG. 3, the word lines WL1, WL2 and WL3 according to the present embodiment may be configured in such a manner that pure word line regions and the crossing regions C are alternately repeated. Here, the gate electrodes 150(G) may be arranged in the pure word line regions in such a way as to each skip one pure word line region such that one pure word line region with no gate electrode is positioned between two pure word line regions with the gate electrodes 150(G). Further, the gate electrodes 150(G) of the word lines WL1 and WL3, which adjoin a certain word line, for example, WL2, may be arranged at positions shifted by 1F from the gate electrodes 150(G) of the certain word line WL2.

Accordingly, a certain gate electrode 150(G) can be operated separately from the gate electrodes 150(G) of unit memory cells which are positioned on the same row as the certain gate electrode 150(G) and adjoin the certain gate electrode 150(G) in the row direction, for example, the gate electrodes 150(G) of the even word line WL2 are positioned between the gate electrodes 150(G) of the odd word lines WL1 and WL3.

The bit line contacts 175(BC) may also be arranged with the same rule as the gate electrodes 150(G).

Figure 4:
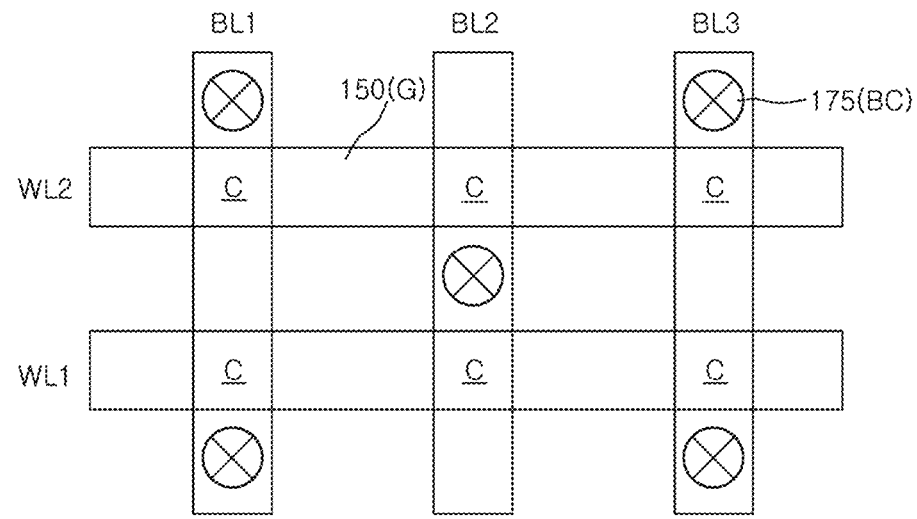
FIG. 4 is a schematic plan view of the semiconductor integrated circuit device illustrating the layout of bit line contacts according to the embodiment of the present invention.

As can be readily seen from FIG. 4, the bit line contacts 175(BC) are arranged in portions of the bit lines BL1, BL2 and BL3 excluding the crossing regions C such that the bit line contacts 175(BC) of the even bit line BL2 are positioned between the bit line contacts 175(BC) of the odd bit lines BL1 and BL3.

In detail, the bit lines BL1, BL2 and BL3 are also configured in such a manner that pure bit line regions and the crossing regions C are alternately repeated. The bit line contacts 175(BC) are arranged in the pure bit line regions in such a way as to each skip one pure bit line region such that one pure bit line region with no bit line contact is positioned between two pure bit line regions with the bit line contacts 175(BC). Further, the bit line contacts 175(BC) of the bit lines BL1 and BL3, which adjoin a certain bit line, for example, BL2, are arranged at positions shifted by 1F from the bit line contacts 175(BC) of the certain bit line BL2.

Figure 5:
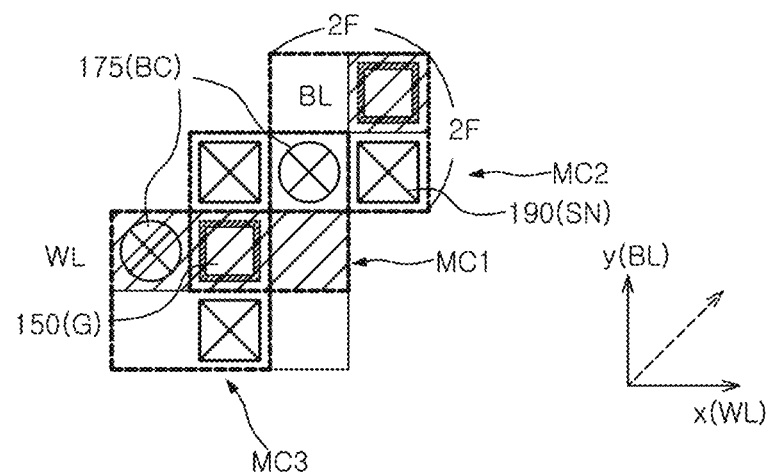
FIG. 5 is a schematic plan view illustrating unit memory cells of the semiconductor integrated circuit device according to the embodiment of the present invention.
Figure 6:
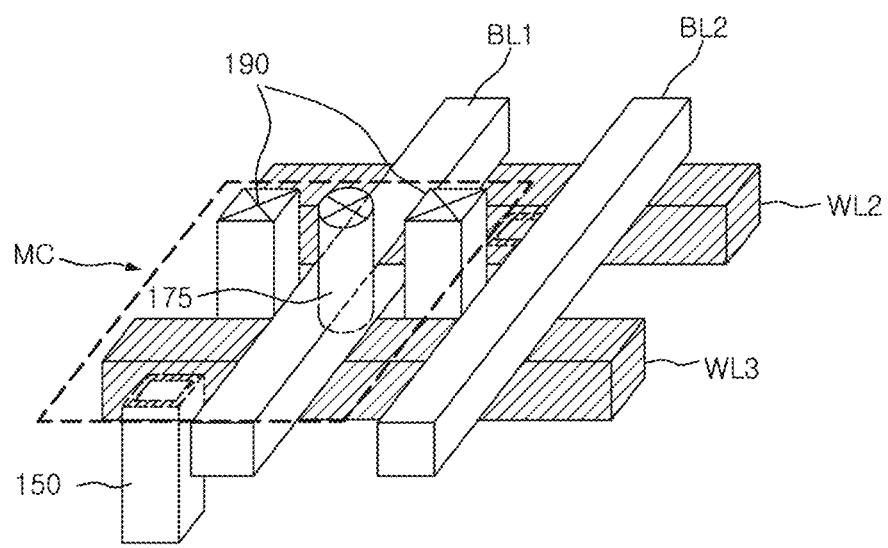
FIG. 6 is a perspective view of a unit memory cell of the semiconductor integrated circuit device according to the embodiment of the present invention.

Referring to FIGS. 5 and 6, when observing the layout of the entire cell array, unit memory cells MC1, MC2 and MC3 may be arranged in a diagonal direction of the word lines WL and the bit lines BL. Each of the unit memory cells MC1, MC2 and MC3 has a length of 2F in a word line direction and 2F in a bit line direction, and thus occupies an area of $4F^2$.

When observing the individual unit memory cells MC1, MC2 and MC3, a certain unit memory cell, for example, MC1 shares the bit line contact 175(BC) with a first adjoining unit memory cell MC2 and shares the gate electrode 150(G) with a second adjoining unit memory cell MC3.

Hereafter, a method for manufacturing a semiconductor integrated circuit device in accordance with another embodiment of the present invention will be described by processes.

Figure 7:
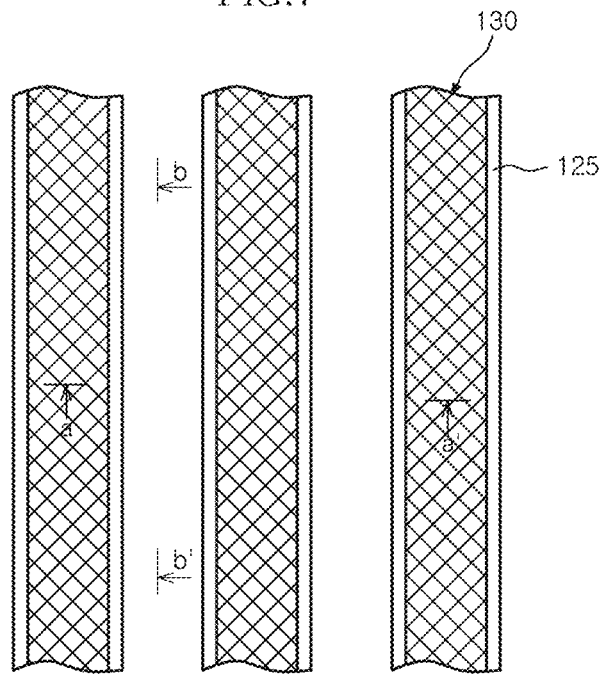
FIGS. 7 to 9 are plan views illustrating sequentially the processes of a method for manufacturing a semiconductor integrated circuit device in accordance with another embodiment of the present invention.
Figure 8:
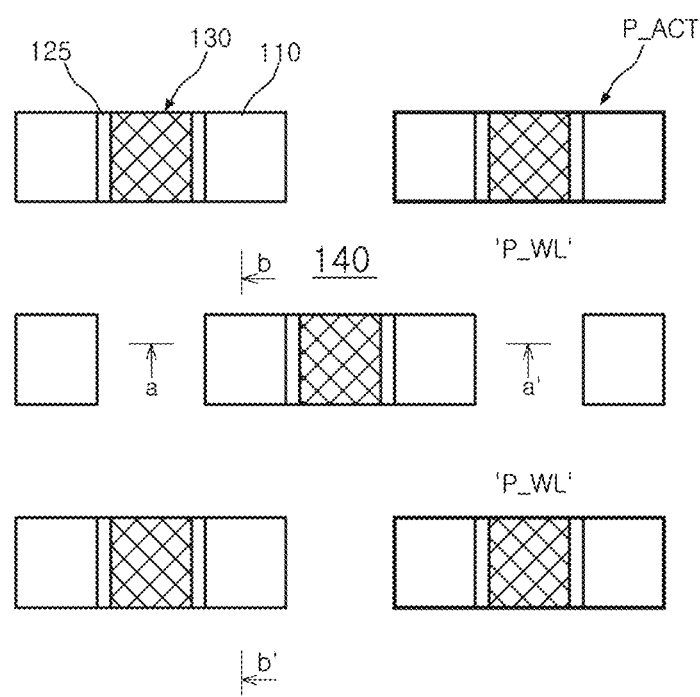
Figure 9:
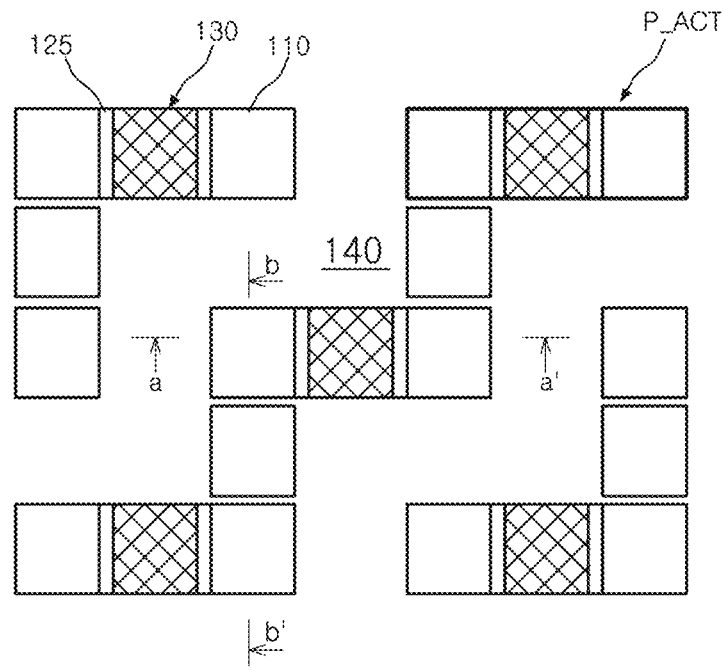

FIGS. 7 to 9 are plan views illustrating sequentially the processes of a method for manufacturing a semiconductor integrated circuit device in accordance with another embodiment of the present invention, FIGS. 10 to 13 are cross-sectional views taken along the line a-a' of FIGS. 7 to 9 and 1, and FIGS. 14 to 17 are cross-sectional views taken along the line b-b' of FIGS. 7 to 9 and 1.

Figure 10:
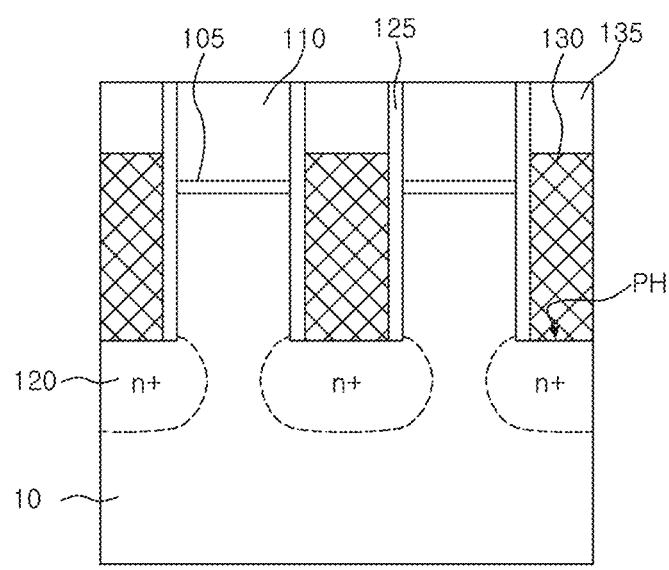
FIGS. 10 to 13 are cross-sectional views taken along the line a-a' of FIGS. 7 to 9 and 1.
Figure 14:
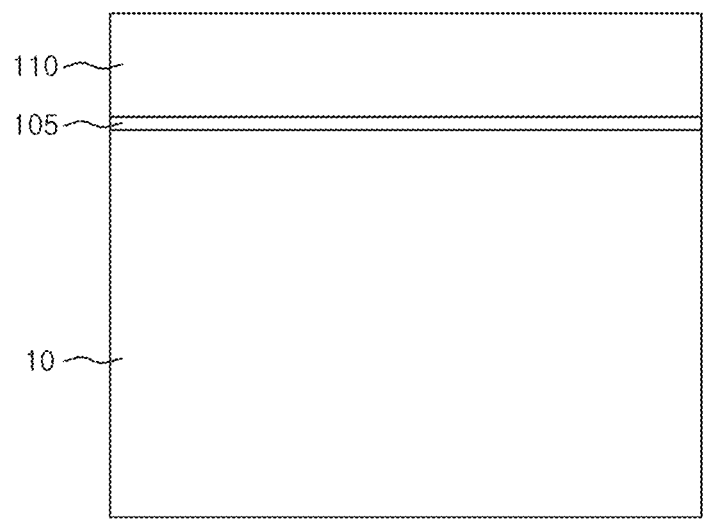
FIGS. 14 to 17 are cross-sectional views taken along the line b-b' of FIGS. 7 to 9 and 1.

Referring to FIGS. 7, 10 and 14, after sequentially forming a pad oxide layer 105 and a silicon nitride layer 110 on a semiconductor substrate 10, a mask pattern (not shown) is formed to expose bit line forming regions. By sequentially etching the silicon nitride layer 110, the pad oxide layer 105 and the semiconductor substrate 10 in the form of the mask pattern, preliminary line holes PH are formed. Thereafter, the mask pattern is removed.

By implanting n-type impurities into the bottoms of the preliminary line holes PH, first junction regions 120 are formed. Sidewall spacers 125 are formed on the sidewalls of the preliminary line holes PH by using a dielectric layer. Next, after filling the preliminary line holes PH with a conductive layer, line contacts 130 are formed by recessing the conductive layer by a predetermined thickness. A cap dielectric layer 135 is formed on the line contacts 130 in the preliminary line holes PH so as to protect the line contacts 130.

Figure 11:
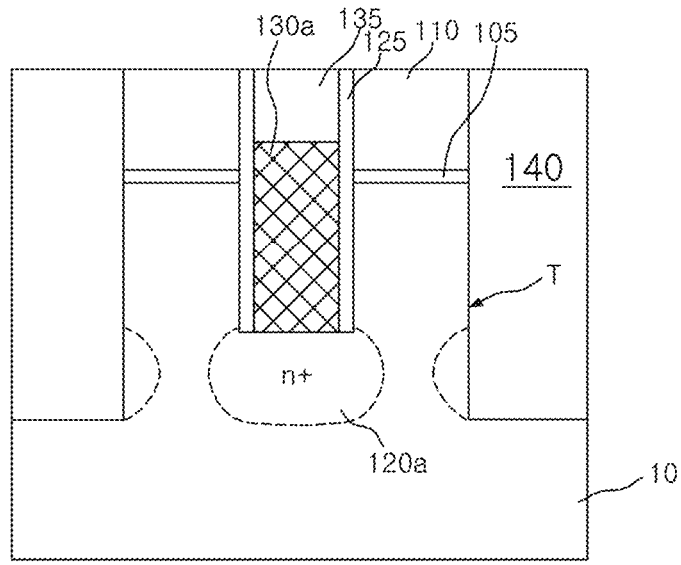
Figure 15:
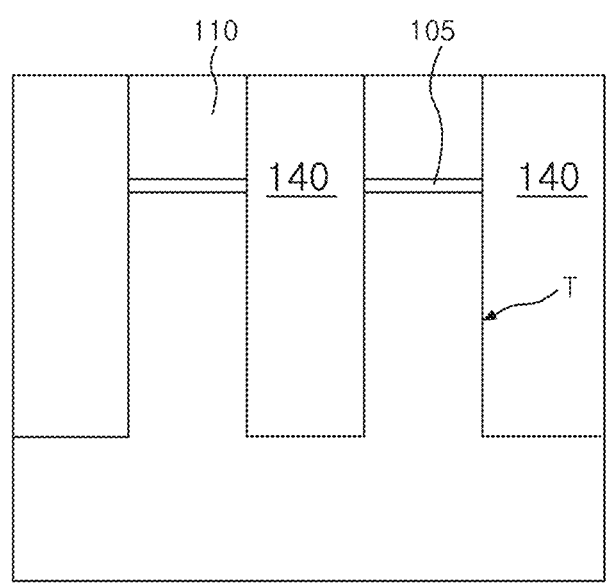

Referring to FIGS. 8, 11 and 15, a preliminary active mask (not shown) is formed on the semiconductor substrate 10. Trenches T are formed by etching the resultant semiconductor substrate 10 using the preliminary active mask, and then, the preliminary active mask is removed. By filling a dielectric substance in the trenches T, an isolation layer 140 is formed to delimit preliminary active regions P_ACT. The preliminary active mask may have a phase opposite to that of the preliminary active regions P_ACT. In other words, the preliminary active mask is formed in the form of the isolation layer 140.

As the preliminary active regions P_ACT are delimited by the isolation layer 140, the first junction regions 120 become drain regions 120a each of which has a area of $1F^2$, and also, the line contacts 130 become first bit line contacts 130a each of which has a area of $1F^2$ as well.

Accordingly, the preliminary active regions P_ACT comprise the drain regions 120a (or the first bit line contacts 130a) and regions of the silicon nitride layer 110 which are respectively formed on both sides of the drain regions 120a (or the first bit line contacts 130a) and each of which has an area of $1F^2$. Such preliminary active regions P_ACT may be arranged in such a way as to define a plurality of rows. The preliminary active regions P_ACT of each row may be arranged at positions separated from adjoining rows of other preliminary active regions P_ACT.

Figure 12:
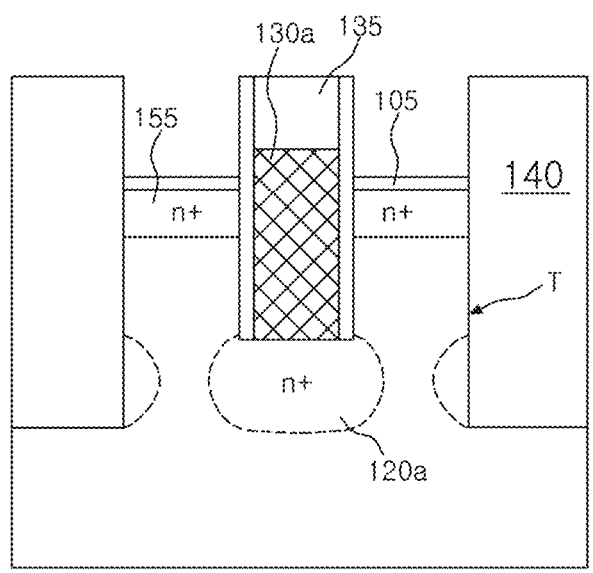
Figure 16:
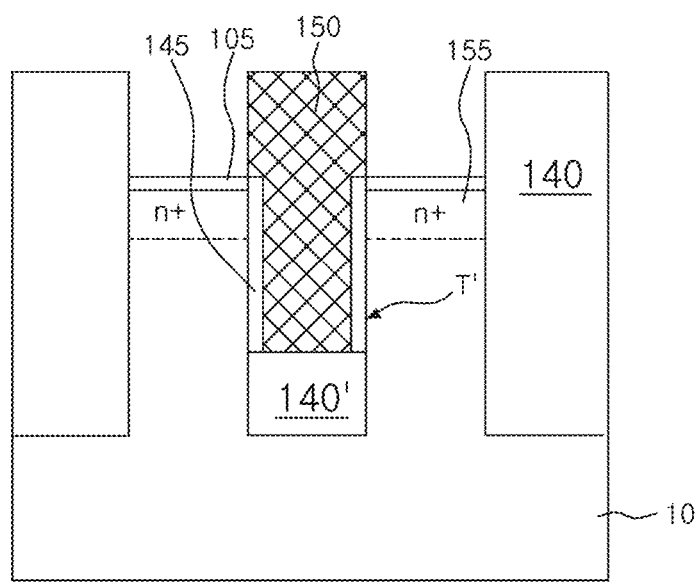

Referring to FIGS. 9, 12 and 16, predetermined portions of the isolation layer 140 between the preliminary active regions P_ACT are exposed using a mask for gate electrodes, and then, the exposed portions of the isolation layer 140 are recessed such that the exposed portions of the isolation layer 140 may remain at the bottoms of the trenches T (see FIG. 16). The reference numeral 140' indicates the remaining isolation layer. Then, after forming sidewall spacers 145 on the sidewalls of the trenches T over the remaining isolation layer 140' by using a dielectric layer, a conductive substance is filled in the trenches T and is planarized, by which gate electrodes 150 are formed. The sidewall spacers 145 serve substantially as a gate dielectric layer. Thus, the gate electrodes 150 are surrounded by the sidewall spacers 145 and the remaining isolation layer 140'.

After exposing the pad oxide layer 105 by removing the silicon nitride layer 110 remaining on the semiconductor substrate 10, second junction regions are formed by implanting n-type impurities through the exposed pad oxide layer 105. The second junction regions are formed on both sides of the gate electrodes 150 and on both sides of the first bit line contacts 130a, and serve as source regions 155 of the transistors. Due to the removal of the silicon nitride layer 110 with a predetermined height, the gate electrodes 150, the isolation layer 140, the first bit line contacts 130a and the cap dielectric layer 135 project from the surface of the semiconductor substrate 10 by the predetermined height.

Figure 13:
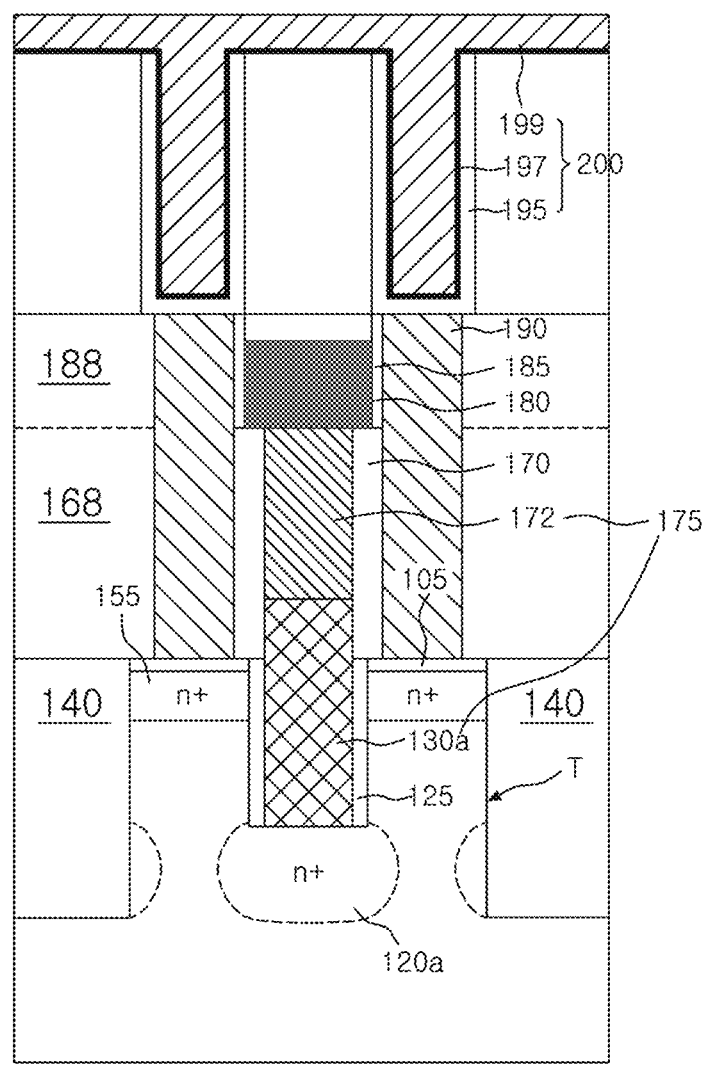
Figure 17:
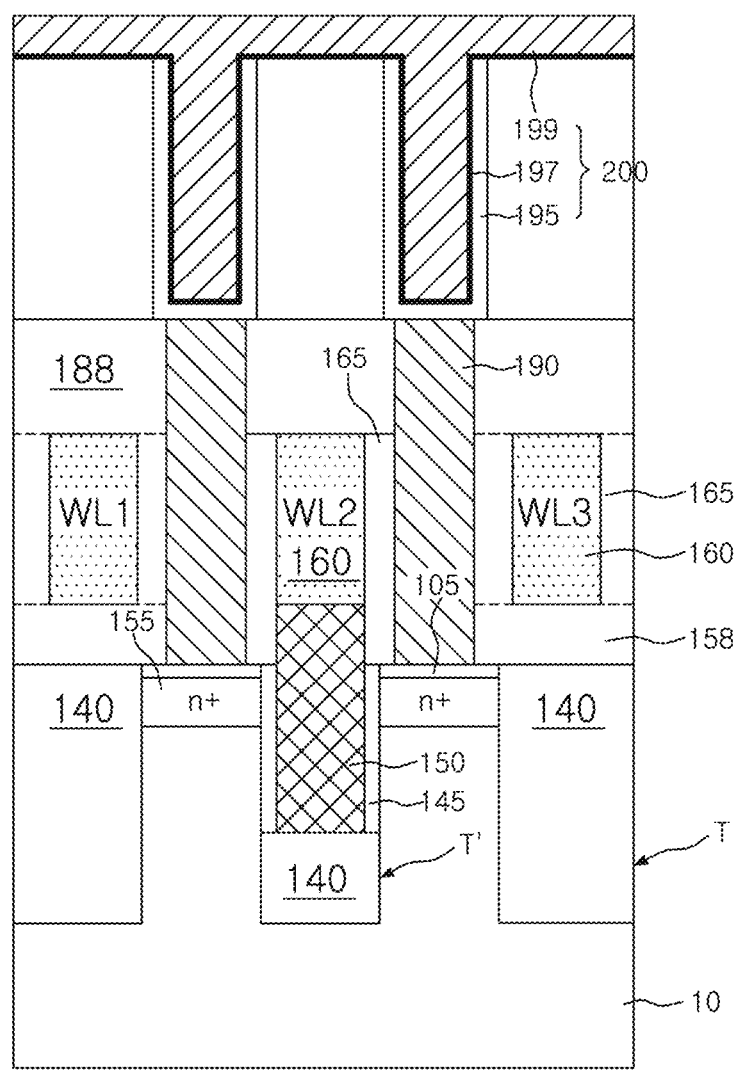

Referring to FIGS. 10, 13 and 17, a dielectric layer 158 is deposited on the resultant semiconductor substrate 10 and is planarized to expose the upper end surfaces of the gate electrodes 150. After forming a conductive layer for word lines over the resultant semiconductor substrate 10, by etching the conductive layer for word lines, word lines 160 are formed such that the word lines 160 contact the gate electrodes 150 and extend along a direction (indicated by P_WL in FIG. 8) along the x direction of the drawing in spaces between the preliminary active regions P_ACT. Word line spacers 165 are formed on the sidewalls of the word lines 160 by using a dielectric layer. While not shown in FIG. 17, a hard mask layer (not shown) may be additionally formed on the word lines 160. The word line spacers 165 function to isolate bit lines to be formed later from the word lines 160. A silicon nitride layer may be used as the word line spacers 165 and the hard mask layer.

After forming an interlayer dielectric layer 168 on the resultant semiconductor substrate 10 which is formed with the word lines 160, predetermined portions of the interlayer dielectric layer 168 are etched in such a way as to expose the first bit line contacts 130a, by which bit line contact holes (not shown) are formed. Bit line contact spacers 170 are formed on the sidewalls of the bit line contact holes by using a dielectric layer. The bit line contact spacers 170 are also formed of a dielectric substance. By filling a conductive substance in the bit line contact holes, second bit line contacts 172 are formed. The first and second bit line contacts 130a and 172 serve as bit line contacts 175 which electrically connect the bit lines to be formed later with the drain regions 120a.

By depositing a metal layer on the bit line contacts 175 and patterning the metal layer, bit lines 180 are formed. Since the bit lines 180 are formed through deposition and patterning of the metal layer, it is possible to secure the substance characteristics and the line width characteristics of the metal layer when compared to the case of forming bit lines through burying. Thereafter, bit line spacers 185 are formed on both sidewalls of the bit lines 180 by using a dielectric substance.

An interlayer dielectric layer 188 is further formed on the resultant semiconductor substrate 10 which is formed with the bit lines 180. By etching the interlayer dielectric layers 168 and 188 in such a way as to expose the source regions 155, storage node contact holes (not shown) are formed.

Next, after forming sidewall spacers on the sidewalls of the storage node contact holes, by filling a conductive substance in the storage node contact holes, storage node contacts 190 are formed for the respective source regions 155. Storage capacitors 200 are formed over the respective storage node contacts 190. Here, each of the storage capacitors 200 may comprise a storage electrode 195, a dielectric layer 197 and an upper plate electrode 199. The storage electrode 195 may have various shapes. In the present embodiment, for example, the storage electrodes 195 are formed in a cylindrical shape.

The memory cell according to the present embodiment is structured, for example, in such a way as to share a word line with a memory cell adjoining in a column direction and share a bit line with a memory cell adjoining in a row direction.

In the memory cell structure according to the present embodiment, instead of realizing switching elements with complicated three-dimensional structures at the crossing points of word lines and bit lines, the bit line contacts are formed at the positions separated by 1F from the crossing points of the word lines and the bit lines.

Hence, a memory cell can be formed within a limited area of $4F^2$ without adopting the complicated three-dimensional cell structure, and thus the number of manufacturing processes may decrease.

It is to be noted that exemplary processes have been explained in the present embodiment and the present invention is not limited to such an embodiment. Therefore, it can be appreciated that the above-stated structure may be formed through various processing steps without departing from the scope of the present invention.

Figure 18:
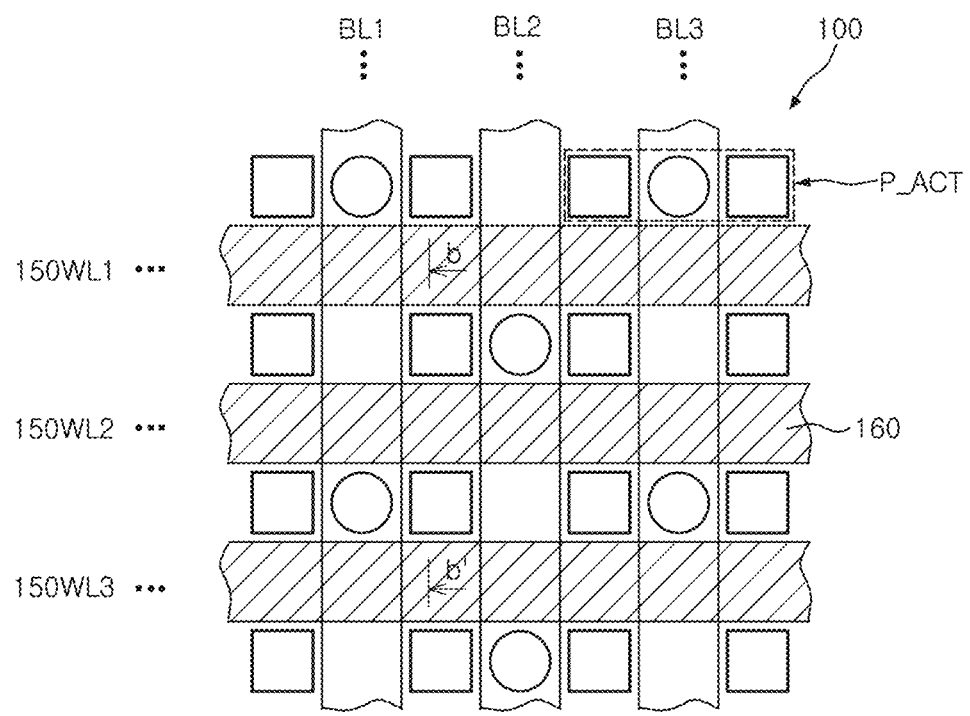
FIG. 18 is a plan view illustrating a semiconductor integrated circuit device in accordance with another embodiment of the present invention.
Figure 19:
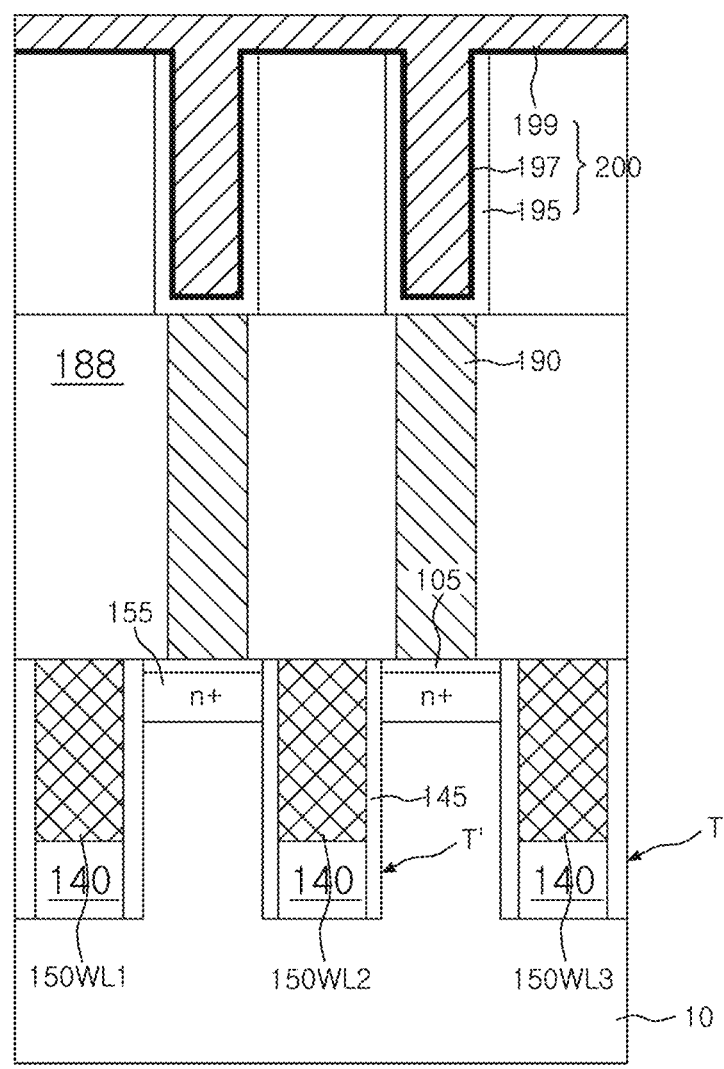
FIG. 19 is a cross-sectional view taken along the line b-b' of FIG. 18.

FIG. 18 is a plan view illustrating a semiconductor integrated circuit device in accordance with another embodiment of the present invention, and FIG. 19 is a cross-sectional view taken along the line b-b' of FIG. 18.

In the aforementioned embodiment, as can be seen from FIG. 17, the word lines WL1, WL2 and WL3: 160 are formed on the semiconductor substrate 10 and partially overlap with the storage node contacts 190.

In this case, interference and coupling of signals may occur between the storage node contacts 190 and the word lines WL1, WL2 and WL3: 160. Further, due to the interference and coupling of signals, noise may be generated from plate electrodes 199.

In the present embodiment, in order to decrease the noise margin of the plate electrodes 199, word lines 150WL1, 150WL2 and 150WL3 are buried in a semiconductor substrate 10.

The buried type word lines 150WL1, 150WL2 and 150WL3 according to the present embodiment may be formed by defining predetermined line holes (not shown) in portions corresponding to word line forming regions (P_WL in FIG. 8) rather than defining holes for gate electrodes (see FIGS. 9, 12 and 16) when forming the gate electrodes 150 in the aforementioned embodiment, by forming a gate dielectric layer 145 on the inner surfaces of the line holes, and then by filling a conductive layer in the line holes.

According to this fact, the word lines 150WL1, 150WL2 and 150WL3 are formed in trenches formed in regions of the isolation layer 140 corresponding to the spaces (P_WL in FIG. 8) between the rows of the preliminary active regions P_ACT.

Therefore, as the word lines 150WL1, 150WL2 and 150WL3 are buried in the semiconductor substrate 10, overlapping portions between the word lines 150WL1, 150WL2 and 150WL3 and the storage node contacts 190 are removed. As a consequence, because interference and coupling of signals may be reduced between the word lines 150WL1, 150WL2 and 150WL3 and the storage node contacts 190, it is possible to reduce generation of noise from plate electrodes.

Moreover, since the word lines are formed using a currently doped polysilicon layer unlike bit lines, it is possible to bury the word lines in the semiconductor substrate, and difficulties are not caused in securing the characteristics of the word lines.

In addition, because unevenness on the surface of semiconductor substrate due to formation of the word lines may be diminished, the number of a planarization process may decrease.

While certain embodiments have been described above, it will be understood to those skilled in the art that the embodiments described are by way of example only. Accordingly, the semiconductor integrated circuit device and the method for manufacturing the same described herein should not be limited based on the described embodiments. Rather, the semiconductor integrated circuit device and the method for manufacturing the same described herein should only be limited in light of the claims that follow when taken in conjunction with the above description and accompanying drawings.

What is claimed is:

1. A semiconductor integrated circuit device comprising:
    first to third word lines buried in a semiconductor substrate and extending parallel to one another with a predetermined spacing along a first direction;
    first to third bit lines extending parallel to one another on the semiconductor substrate with a predetermined spacing along a second direction crossing the first direction, and formed in an upper region than a region that the first to third word lines are formed;
    a first storage node of a first memory cell formed over the semiconductor substrate of an inner space which is surrounded by the first word line, the second word line, the first bit line and the second bit line when viewed from top of the semiconductor substrate;
    a second storage node of a second memory cell formed over the semiconductor substrate of an inner space which is surrounded by the first word line, the second word line, the second bit line and the third bit line when viewed from top of the semiconductor substrate;
    a third storage node of a third memory cell formed over the semiconductor substrate of an inner space which is surrounded by the second word line, the third word line, the first bit line and the second bit line when viewed from top of the semiconductor substrate,
    first to third drain regions electrically connected with the first to third bit lines respectively, and formed in lower portions of the substrate under the first to third bit lines, respectively; and
    first to third source regions formed in upper portions of the substrate under the first to third storage nodes, respectively,
    wherein the first memory cell and the third memory cell share the second word line, wherein the first memory cell and the second memory cell share the second bit line.

2. The semiconductor integrated circuit device according to claim 1, wherein the first to third word lines are formed in an isolation layer to have a trench structure.

3. The semiconductor integrated circuit device according to claim 2, wherein the word lines include a gate dielectric layer formed on inner sidewalls of the isolation layer.

4. The semiconductor integrated circuit device according to claim 1, wherein a length of each side of each of the spaces in which each of the first to the third storage nodes is formed has a minimum feature size in a word line direction and a bit line direction.

* * * * *